US008728926B2

(12) United States Patent
Hong

(10) Patent No.: US 8,728,926 B2
(45) Date of Patent: May 20, 2014

(54) SEMICONDUCTOR DEVICE AND METHOD FOR MANUFACTURING A SEMICONDUCTOR DEVICE

(71) Applicants: Semiconductor Manufacturing International Corporation, Shanghai (CN); Semiconductor Manufacturing International Corporation, Beijing (CN)

(72) Inventor: Zhongshan Hong, Shanghai (CN)

(73) Assignees: Semiconductor Manufacturing International (Shanghai) Corporation (CN); Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/623,340

(22) Filed: Sep. 20, 2012

(65) Prior Publication Data

US 2013/0168747 A1   Jul. 4, 2013

(30) Foreign Application Priority Data

Dec. 31, 2011   (CN) .......................... 2011 1 0459120

(51) Int. Cl.
*H01L 21/28* (2006.01)
(52) U.S. Cl.
USPC ........... 438/595; 438/287; 438/510; 438/585; 438/591; 257/E21.19
(58) Field of Classification Search
USPC .............................. 438/595; 257/288, E21.19
See application file for complete search history.

(56) References Cited

U.S. PATENT DOCUMENTS

| 5,985,726 | A | * | 11/1999 | Yu et al. ........................ 438/301 |
| 6,864,145 | B2 | | 3/2005 | Hareland et al. |
| 7,148,099 | B2 | | 12/2006 | Datta et al. |
| 7,354,839 | B2 | * | 4/2008 | Wei et al. ....................... 438/305 |
| 2002/0048970 | A1 | * | 4/2002 | Feudel et al. .................. 438/787 |
| 2003/0082861 | A1 | * | 5/2003 | Mayuzumi ..................... 438/197 |
| 2004/0026752 | A1 | * | 2/2004 | Makabe et al. ................ 257/410 |
| 2008/0026519 | A1 | * | 1/2008 | Liu et al. ....................... 438/197 |
| 2009/0294877 | A1 | * | 12/2009 | Tsutsui .......................... 257/411 |
| 2009/0321853 | A1 | * | 12/2009 | Cheng ............................ 257/410 |
| 2010/0090264 | A1 | * | 4/2010 | Moll et al. ..................... 257/301 |
| 2012/0049247 | A1 | * | 3/2012 | Lee et al. ...................... 257/288 |

FOREIGN PATENT DOCUMENTS

CN   200880016037   3/2010

* cited by examiner

*Primary Examiner* — Angel Roman
(74) *Attorney, Agent, or Firm* — Innovation Counsel LLP

(57) ABSTRACT

The present invention discloses a method for manufacturing a semiconductor device. According to the method provided by the present disclosure, a dummy gate is formed on a substrate, removing the dummy gate to form an opening having side walls and a bottom gate, a dielectric material is formed on at least a portion of the sidewalls of the opening and the bottom surface of the opening, and a pre-treatment is performed to a portion of the dielectric material layer on the sidewalls of the opening, and thus the properties of the dielectric material is changed, and then the pre-treated dielectric material on the sidewalls of the opening is removed by a selective process. The semiconductor device manufactured by using the method of the present disclosure is capable of effectively reducing parasitic capacitance.

15 Claims, 7 Drawing Sheets

SEMICONDUCTOR DEVICE AND METHOD FOR MANUFACTURING A SEMICONDUCTOR DEVICE

CROSS-REFERENCE TO RELATED APPLICATIONS

This application claims priority to Chinese Patent Application No. CN201110459120.4, filed on Dec. 31, 2011 and entitled "Method For Manufacturing A Semiconductor Device", which is incorporated herein by reference in its entirety.

FIELD OF THE INVENTION

Embodiments of the invention generally relate to semiconductor device and a method for manufacturing a semiconductor device, and more specifically, relate to a metal oxide semiconductor field effect transistor having a gate conductor with a reduced parasitic capacitance.

DESCRIPTION OF THE RELATED ART

In semiconductor industry, the metal oxide semiconductor field effect transistor (MOSFET) having a high-k material and a metal gate has been more and more widely used.

A typical method for manufacturing a high-k material/metal gate structure is a gate-last process. In the gate-last process, a poly-silicon layer on a sacrificial gate oxide layer is used as a sacrificial gate structure (also referred to as a dummy gate structure) to occupy the position of a gate. After forming the sacrificial gate electrode, the device is subjected to a high temperature treatment (e.g. active annealing of source/drain regions. The dummy gate structure is replaced with a high-k material layer and a metal gate. This gate-last process is advantageous in that it prevents the high-k material layer and the metal gate from being damaged by the high temperature treatment because the position of the gate is occupied by the poly-silicon dummy gate during the high temperature treatment and the high-k material layer and the metal gate are formed after the high temperature treatment.

However, a severe disadvantage of the gate-last process resides in that the high-k material not only exists below the metal gate but also exists on the vertical sidewalls of the metal gate, which results in an excessively high parasitic capacitance.

SUMMARY

The inventor of the present disclosure has found some problems existing in the above-mentioned gate-last process and proposes a new technical solution to address at least one of these problems.

An object of the present disclosure is to provide a technical solution for manufacturing a semiconductor device.

According to a first aspect of the present disclosure, there is provided a method for manufacturing a semiconductor device, comprising: forming a dummy gate on a substrate; removing the dummy gate to form an opening having sidewalls and a bottom surface; forming a dielectric material layer on at least a portion of the sidewalls of the opening and the bottom surface of the opening; performing a pre-treatment to a portion of the dielectric material layer on the sidewalls of the opening, and removing the pre-treated dielectric material layer from the sidewalls of the opening. The pre-treatment changes at least one property of the pre-treated portion of the dielectric material layer.

The performing a pre-treatment to a portion of the dielectric material layer on the sidewalls of the opening comprises treating the dielectric material layer on the sidewalls of the opening by ion implantation.

The ion implantation is performed using Si ion, F ion, Ge ion, O ion, or Ar ion.

The ion implantation energy is about 200 ev~about 1 kev. The ion implantation has a dosage of about $3\times10^{14}/cm^{-2}$~about $1\times10^{16}/cm^{-2}$.

The ion implantation is performed at a certain angle with respect to the sidewalls of the opening such that the bottom surface of the opening is protected by the sidewalls.

The angle of the ion implantation depends on a sidewall height and a bottom width of the opening.

The angle between a direction of ion implantation and the sidewalls of said opening is about 30~about 60 degrees.

The angle is formed by tilting an ion beam or rotating the substrate.

The method for manufacturing a semiconductor device according to one embodiment of the present disclosure further comprises: performing annealing for the dielectric material that has been subjected to the pre-treatment.

The removing the pre-treated dielectric material layer includes wet etching.

The method for manufacturing a semiconductor device according to one embodiment of the present disclosure further comprises: depositing a metal in the opening; and forming a gate conductor in the opening.

The dielectric material layer is a high-k material.

The high-k material is $HfO_2$, $TiO_2$, $Al_2O_3$, $ZrO_2$, $Ta_2O_5$ or $La_2O_3$.

According to another embodiment of the present disclosure, there is provided a semiconductor device, comprising a substrate; a gate dielectric layer formed on the substrate; a gate formed on the gate dielectric layer. The gate dielectric layer is form on a bottom of both side walls of the gate.

The semiconductor device according to one embodiment of the present disclosure further comprises an interfacial layer between the gate dielectric layer and the substrate.

The gate dielectric layer formed on the side walls of the gate has a height of about 10~about 100 Å.

The interfacial layer is a silicon oxide layer, the gate dielectric layer is a high-k material layer and the gate is a metal layer.

The gate dielectric layer formed on the side walls of the gate has a height of about 10~about 100 Å.

Further features of the present disclosure and advantages thereof will become apparent from the following detailed description of exemplary embodiments according to the present disclosure with reference to the accompanying drawings.

BRIEF DESCRIPTION OF THE DRAWINGS

The accompanying drawings, which constitute a part of the specification, illustrate embodiments of the invention and, together with the description, serve to explain the principles of the invention.

The present disclosure can be better understood by reading the following detailed description with reference to the accompanying drawings.

DESCRIPTION OF THE EMBODIMENTS

Figure 1:
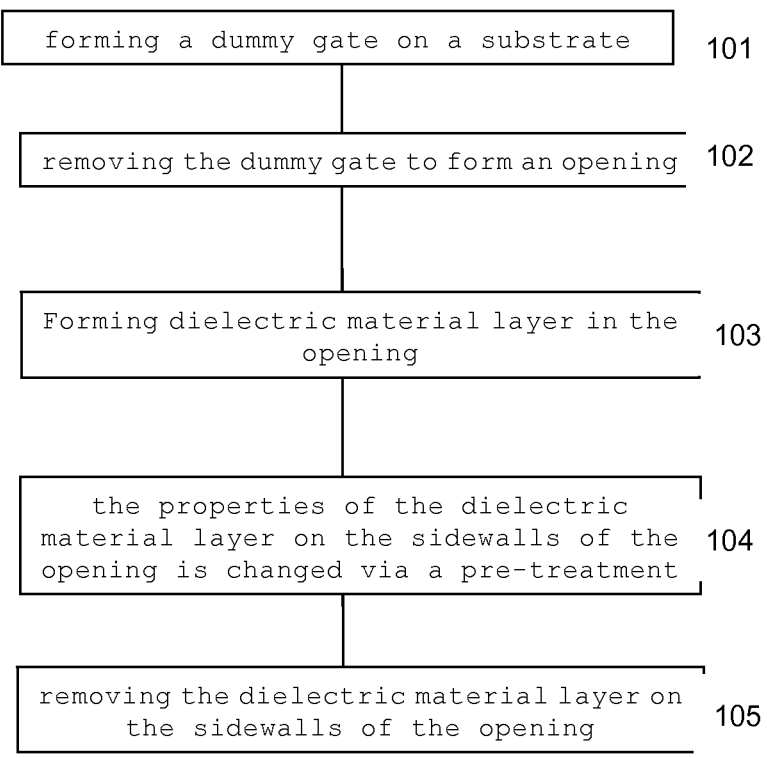
FIG. 1 is a flowchart illustrating a method of manufacturing a semiconductor device according to an embodiment of the present disclosure.

Various exemplary embodiments of the present disclosure will now be described in detail with reference to the drawings. It should be noted that the relative arrangement of the components and steps, the numerical expressions, and numerical values set forth in these embodiments do not limit the scope of the present disclosure unless it is specifically stated otherwise.

Meanwhile, it should be understood that, for the convenience of description, each component in the figures has not been necessarily drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Below, a method for manufacturing a MOSFET using a gate-last process according to the present disclosure will be described in conjunction with the accompanying drawings.

FIG. 1 shows a flowchart of a method for manufacturing a semiconductor device according to an embodiment of the present disclosure.

Referring to FIG. 1, the method for manufacturing a semiconductor device in the embodiment comprises:

Forming a dummy gate on a substrate.

Removing the dummy gate to form an opening. The opening, as described below in greater detail with reference to FIGS. 2A-2G, has sidewalls and a bottom surface.

Forming a dielectric material layer on the substrate. A dielectric material layer is formed on at least a portion of the sidewalls of the opening as well as on the bottom surface of the opening.

Pre-treating a part of the dielectric material layer on the sidewalls of the opening to change at least one property of the pre-treated part of the dielectric material layer.

Removing the pre-treated dielectric material layer from the sidewalls of the opening.

FIGS. 2A to 2G are cross-sectional views of a manufacturing method of a semiconductor device according to one embodiment of the present disclosure. The method for manufacturing a semiconductor device according to an embodiment of the present disclosure will be further described in detail in conjunction with FIGS. 2A to 2G.

Figure 2A:
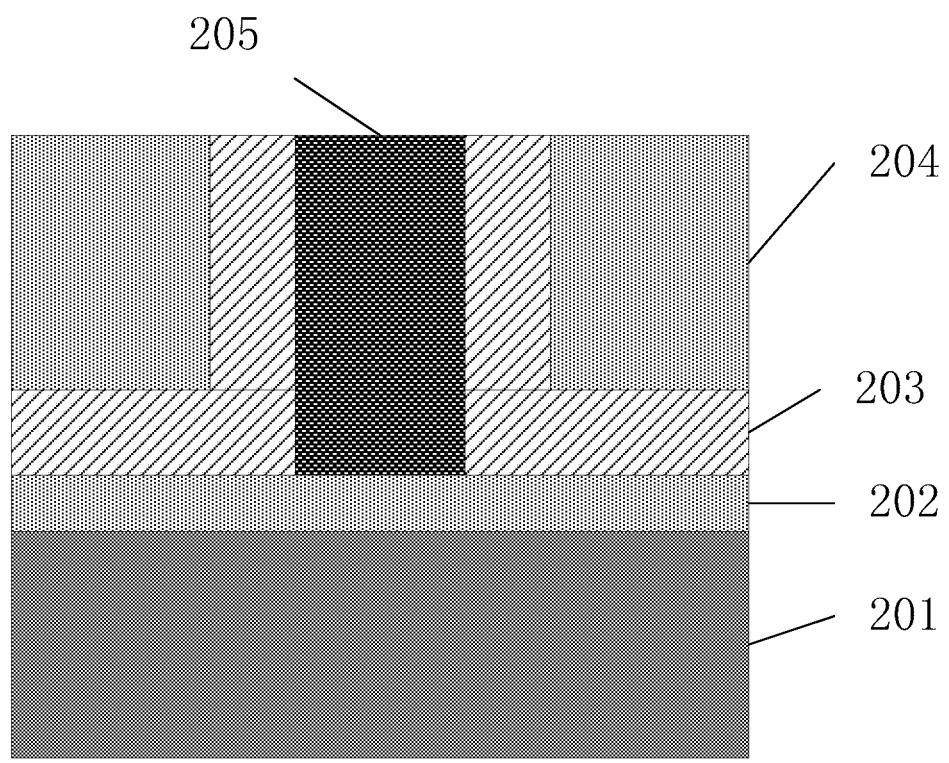
FIGS. 2A to 2G are cross-sectional views of a manufacturing method of a semiconductor device according to an embodiment of the present disclosure.

Referring to FIG. 2A, a dummy gate is formed on a substrate (step 101).

As shown in FIG. 2A, a sacrificial gate oxide layer 202, a first sacrificial layer (not shown), a hard mask (not shown) and an etch stop layer (not shown) is formed on the semiconductor substrate 201 (usually silicon). The first sacrificial layer can be formed with poly-silicon. A patterned dummy gate 205, a patterned hard mask and a patterned etch stop layer are formed on the semiconductor substrate 201. A nitride layer 203 and an oxide layer 204 is formed on the semiconductor substrate 201. A source and drain impurity layer (not shown) may be formed by implanting lightly doped source and drain impurities before forming the nitride layer 203 and by implanting a heavily doped source and drain impurities after forming the nitride layer. After forming the source and drain impurity layer, the substrate may be heat treated to form a source and drain layer. The oxide layer 204 on the etch stop layer is removed using a conventional chemical mechanical polishing ("CMP") process. Then, the hard mask and the etch stop layer is removed.

Figure 2B:
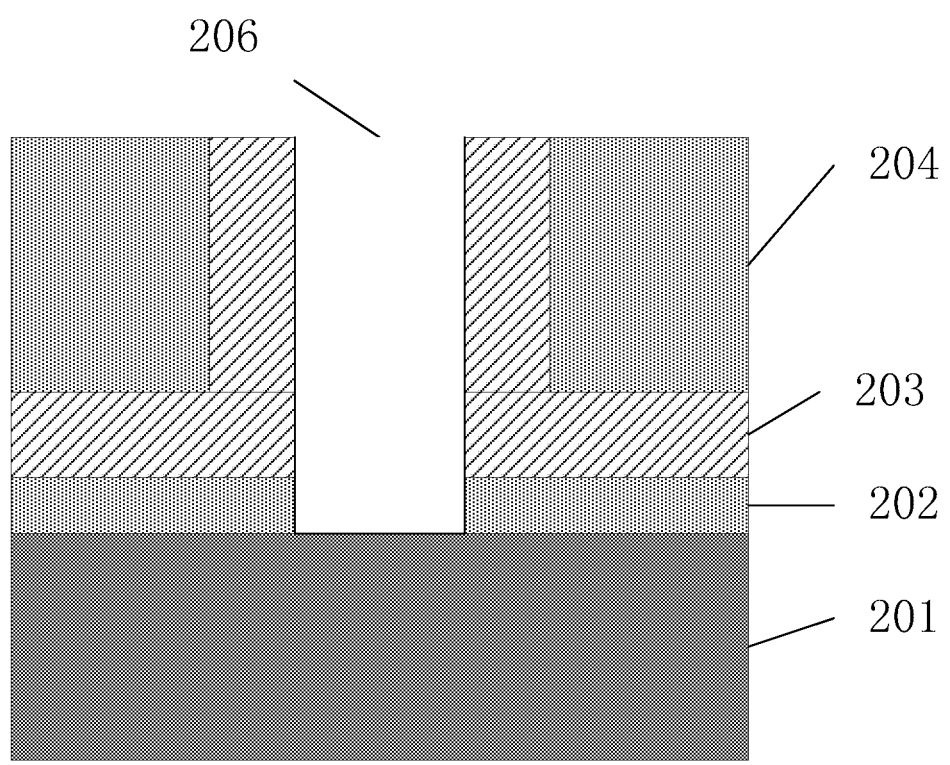

As shown in FIG. 2B, the dummy gate 205 is removed, and thus an opening 206 is formed (step 102).

Figure 2C:
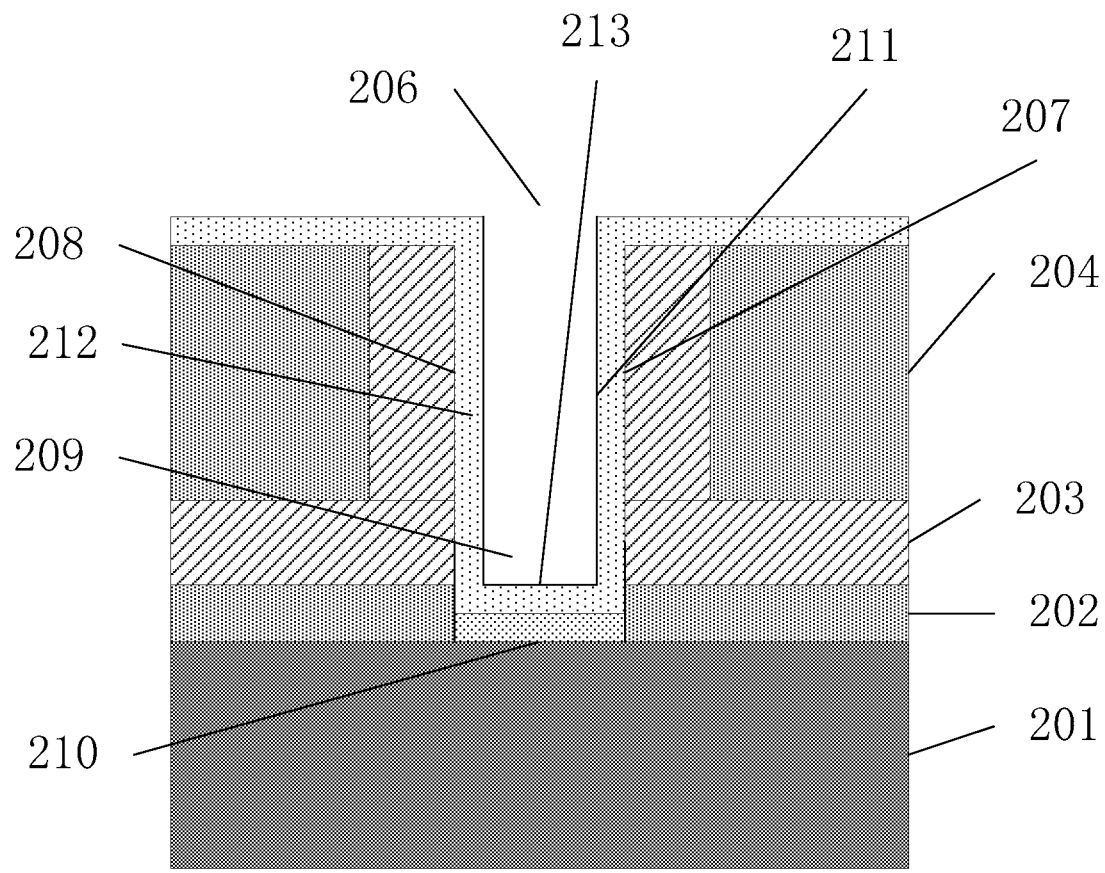

Next, as shown in FIG. 2C, dielectric material is deposited over the entire surface of the semiconductor device, to form the dielectric material on the first sidewall 207, the second sidewall 208 and a bottom 209 of the opening 206, respectively. That is, a first dielectric material layer 211, a second dielectric material layer 212 and a third dielectric material layer 213 is formed on the first sidewall 207, the second sidewall 208 and the bottom 209 of the opening 206. (step 103).

In one preferred embodiments shown in FIG. 2C, an interfacial layer 210 is also formed on the substrate 201. The interfacial layer 210 generally serves as a transition layer between the substrate 201 and the third dielectric material layer 213.

The dielectric material employed in step 103 is preferably a dielectric material having a dielectric constant larger than that of the silicon oxide. In one preferred mode, a high-k material may be used. In the present disclosure, the high-k material generally refers to a dielectric material having a dielectric constant larger than 4.0, such as, $HfO_2$, $TiO_2$, $Al_2O_3$, $ZrO_2$, $Ta_2O_5$ or $La_2O_3$, etc.

Next, pre-treatment is performed for the first dielectric material layer 211 and the second dielectric material layer 212 in the opening 206 by ion implantation treatment, and thus the properties of these two dielectric material layers are changed (step 104).

In one embodiment of the present disclosure, the properties of the first dielectric material layer 211 and the second dielectric material layer 212 are changed by means of ion implantation. For example, ion implantation is performed for the first dielectric material layer 211 and the second dielectric material layer 212 using Si, F, Ge, O or Ar ions. Herein, the ion energy for the ion implantation treatment is generally controlled within a range from about 200 ev to about 1 kev, while the dosage of the ion implantation is generally from about $3\times10^{14}/cm^{-2}$ to about $1\times10^{16}/cm^{-2}$.

Figure 2D:
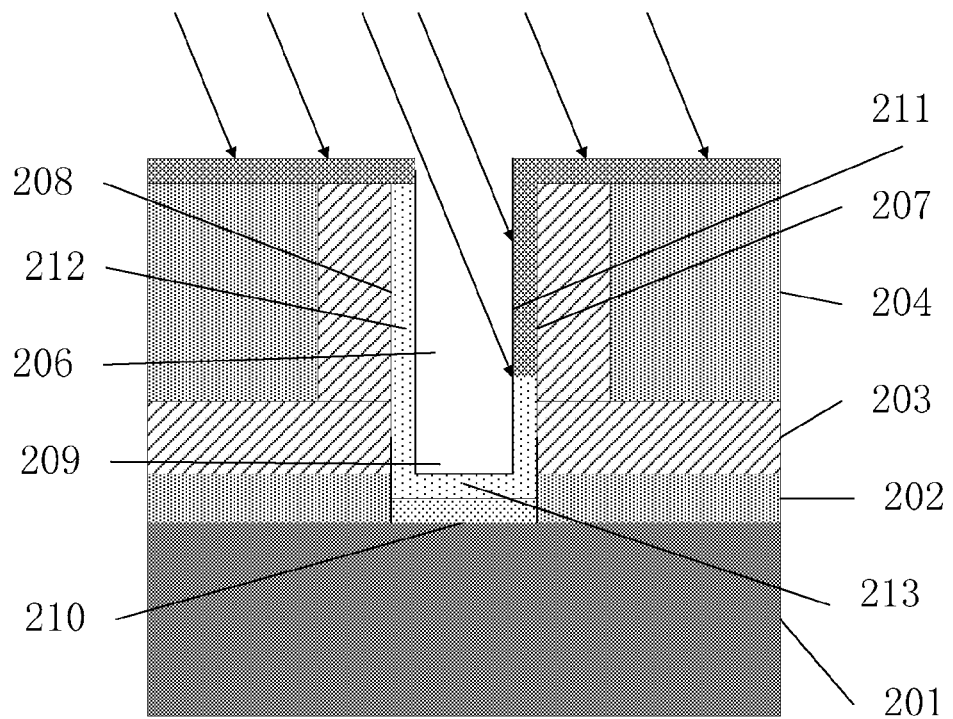
Figure 2E:
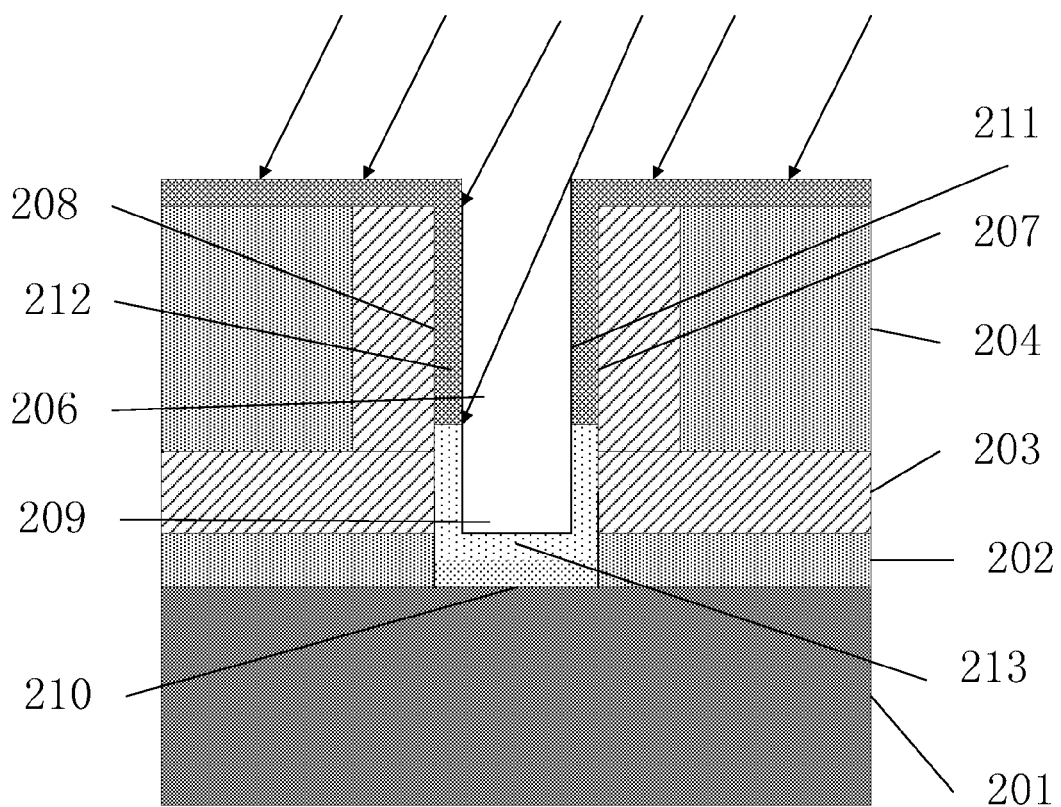

FIGS. 2D and 2E show an exemplary ion implantation treatment. As shown in FIGS. 2D and 2E, ion implantation is performed in a direction at a certain angle with respect to the opening 206 such that the third dielectric material layer 213 on the bottom of the opening 206 is protected by the first sidewall 207 and the second sidewall 208. In this way, only the first dielectric material layer 211 and the second dielectric material layer 212 located on the sidewalls are subjected to ion implantation and are changed in property, while the third dielectric material layer 213 located at the bottom of the opening 206 is not subjected to ion implantation and still keeps its original dielectric properties.

During the above ion implantation treatment, the ion implantation incident angle depends on the aspect ration of the opening, for example the height of the sidewall and the width of the bottom of the opening. Generally this angle is about 30~about 60 degrees.

The above ion implantation treatment can be performed in two steps, that is, a first ion implantation treatment is performed for the first dielectric material layer 211 (as shown in FIG. 2D) and then a second ion implantation treatment is performed for the second dielectric material layer 212 (as shown in FIG. 2E). The first and second ion implantation treatments can be implemented in various manners. For example, in one exemplary embodiment, the first ion implantation treatment is performed at a first incident angle such that the properties of the first dielectric material layer 211 are changed properly. The ion bombardment is then suspended and incident angle of ion beam may be adjusted for the next step. And the second ion implantation treatment is performed at a second incident angle such that the properties of the second dielectric material layer 212 are changed. In addition, in another exemplary embodiment, the first ion implantation treatment is performed at the first incident angle such that the properties of the first dielectric material layer 211 are changed. The ion bombardment is then suspended and the semiconductor device is adjusted for the next ion bombardment (for example, being rotated by a certain angle, such as 90, 180, or 270 degrees). The ion bombardment continues, and thus the second ion implantation treatment is performed after the sample is rotated at a second incident angle such that the properties of the second dielectric material layer 212 are changed.

Furthermore, as shown in FIGS. 2D and 2E, sometimes the bottom layer 213 should not be implanted. In one embodiment, the incident angle of ion implantation can be set such that the bottom portions of the first dielectric material layer 211 and the second dielectric material layer 212 are not implanted. The small amount of the original dielectric materials still remain at bottom of the sidewalls, which will not exert any substantial influences on the overall performance of the device. The angle of ion implantation can also be set such that the dielectric materials on the sidewalls can be completely treated.

Figure 2F:
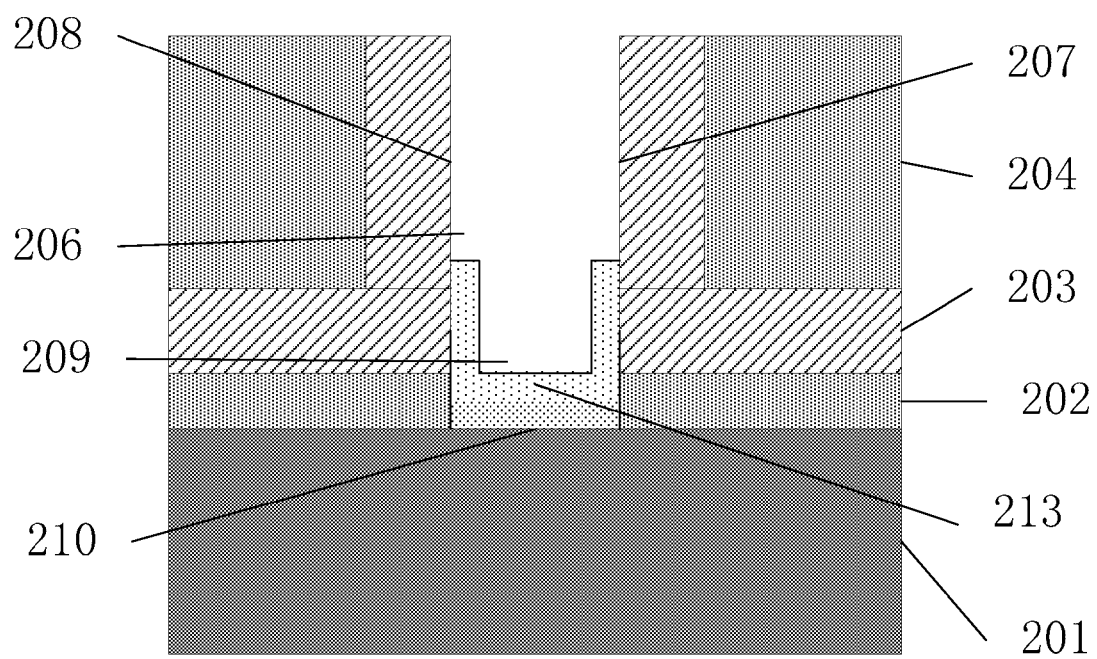

As shown in FIG. 2F, the ion implanted portions of the dielectric material, the first dielectric material layer 211 on the first sidewall 207 and the second dielectric material layer 212 on the second sidewall 208 are removed (step 105). In one exemplary embodiment, the ion implanted dielectric material has a higher etching rate than the dielectric material which is not ion implanted. The first dielectric material layer 211 and the second dielectric material layer 212 can be removed by wet etching. For example, the first dielectric material layer 211 and the second dielectric material layer 212 are etched by using HF solution, ammonia water, hydrogen peroxide solution or a mixture thereof. In one exemplary embodiment, HF solution is prepared in accordance with a volume ratio in which $H_2O$:HF is 500:1~3000:1, and then the dielectric material is etched under a temperature of 70° C.~90° C., for example. Since the first dielectric material layer 211 and the second dielectric material layer 212 have been changed in property, their etching rates are much higher than that of the third dielectric material layer 213. Thus, dielectric materials whose properties have been changed can be removed selectively.

Figure 2G:
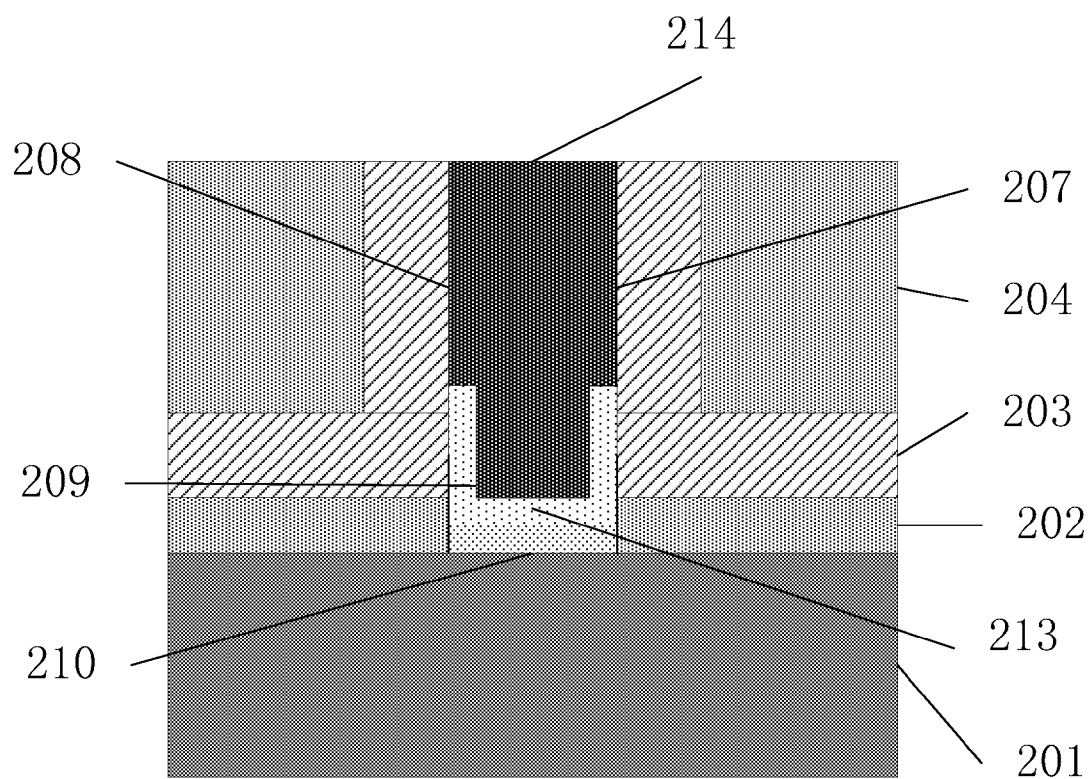

Finally, as shown in FIG. 2G, a gate conductor is filled in the opening 208 by metal deposition. A metal gate 214 is formed using chemical mechanical polishing.

In the semiconductor device manufactured by the method described in the above embodiments, both sidewalls of the metal gate substantially have no high-k materials, and thus parasitic capacitance is reduced. Moreover, the method of the present disclosure is easy to be carried out and has a lot of advantages like low cost and high production yield.

In another embodiment according to the present disclosure, annealing is performed for the dielectric material that has been subjected to a pre-treatment. The annealing can be an ordinary annealing, for example, an annealing performed for 1 minute to 99 minutes under a temperature of 300° C.~600° C. Alternatively, the annealing can be a rapid thermal annealing (RTA) whose processing period can be shortened to an order of millisecond and whose temperature is generally around 900° C.~1300° C.

After the annealing, the ions implanted into the dielectric material together with the molecules in the dielectric material form a new compound, and thus the etching selectivity for a high-k dielectric material is enhanced.

The method of manufacturing a semiconductor device according to the present disclosure as well as the semiconductor device manufactured thereby has been described above in detail.

Although some specific embodiments of the present disclosure have been demonstrated in detail with examples, it should be understood by one of ordinary skill in the relevant art that the above examples are only intended to be illustrative but not to limit the scope of the present disclosure. It should be understood by one of ordinary skill in the relevant art that the above embodiments can be modified without departing from the scope and spirit of the present disclosure. The scope of the present disclosure is defined by the attached claims.

What is claimed is:

1. A method for manufacturing a semiconductor device, comprising:
   forming a dummy gate on a substrate;
   removing the dummy gate to form an opening having sidewalls and a bottom surface;
   forming a dielectric material layer on at least a portion of the sidewalls of the opening and the bottom surface of the opening;
   performing a pre-treatment to a portion of the dielectric material layer on the sidewalls of the opening, wherein the pre-treatment changes at least one property of the pre-treated portion of the dielectric material layer; and
   removing the pre-treated dielectric material layer from the sidewalls of the opening.

2. The method of claim 1, wherein the performing a pre-treatment to a portion of the dielectric material layer on the sidewalls of the opening comprises treating the dielectric material layer on the sidewalls of the opening by ion implantation.

3. The method of claim 2, wherein the ion implantation is performed using Si ion, F ion, Ge ion, O ion, or Ar ion.

4. The method of claim 2, wherein the ion implantation energy is about 200 ev~about 1 kev.

5. The method of claim 2, wherein the ion implantation has a dosage of about $3\times10^{14}/cm^{-2}$~about $1\times10^{16}/cm^{-2}$.

6. The method of claim 2, wherein the ion implantation is performed at a certain angle with respect to the sidewalls of the opening such that the bottom surface of the opening is protected by the sidewalls.

7. The method of claim 6, wherein the angle of the ion implantation depends on a sidewall height and a bottom width of the opening.

8. The method of claim 6, wherein the angle between a direction of ion implantation and the sidewalls of said opening is about 30~about 60 degrees.

9. The method of claim 6, wherein the angle is formed by tilting an ion beam or rotating the substrate.

10. The method of claim 6,
    wherein the ion implantation is performed using Si ion, F ion, Ge ion, O ion, or Ar ion, wherein the ion implantation energy is about 200 ev~about 1 kev, wherein said ion implantation has a dosage of about $3 \times 10^{14}/cm^{-2}$~about $1 \times 10^{16}/cm^{-2}$, and wherein the ion implantation angle depends on a sidewall height and a bottom width of the opening, the angle between a direction of ion bombardment and the sidewalls of said opening is about 30~about 60 degrees.

11. The method of claim 1 further comprising:

performing an annealing on the dielectric material layer after performing the pre-treatment.

12. The method of claim 1, wherein the removing the pre-treated dielectric material layer includes wet etching.

13. The method of claim 1 further comprises:

depositing a metal in the opening; and forming a gate conductor in the opening.

14. The method of claim 1, wherein the dielectric material layer is a high-k material.

15. The method of claim 14, wherein the high-k material is $HfO_2$, $TiO_2$, $Al_2O_3$, $ZrO_2$, $Ta_2O_5$ or $La_2O_3$.

* * * * *